(12) United States Patent
De Boer et al.

(10) Patent No.: US 8,847,177 B2
(45) Date of Patent: Sep. 30, 2014

(54) LUMINESCENT SOLAR CONCENTRATOR

(75) Inventors: Dirk Kornelis Gerhardus De Boer, Den Bosch (NL); Cornelis Reinder Ronda, Aachen (DE); Dirk Jan Broer, Geldrop (NL); Hugo Johan Cornelissen, Waalre (NL)

(73) Assignee: Koninklijke Philips N.V., Eindhoven (NL)

( * ) Notice: Subject to any disclaimer, the term of this patent is extended or adjusted under 35 U.S.C. 154(b) by 8 days.

(21) Appl. No.: 13/508,735

(22) PCT Filed: Nov. 17, 2010

(86) PCT No.: PCT/IB2010/055208
§ 371 (c)(1),
(2), (4) Date: May 9, 2012

(87) PCT Pub. No.: WO2011/064691
PCT Pub. Date: Jun. 3, 2011

(65) Prior Publication Data
US 2012/0223250 A1 Sep. 6, 2012

(30) Foreign Application Priority Data

Nov. 24, 2009 (EP) .................................... 09176890

(51) Int. Cl.
*G01J 1/58* (2006.01)
*G01T 1/00* (2006.01)
*G02B 5/08* (2006.01)
*G02B 19/00* (2006.01)
*H01L 31/052* (2014.01)
*H01L 31/055* (2014.01)

(52) U.S. Cl.
CPC ................ *H01L 31/055* (2013.01); *G02B 5/08* (2013.01); *G02B 19/0033* (2013.01); *G02B 19/0076* (2013.01); *G02B 19/0028* (2013.01); *G02B 19/0042* (2013.01); *Y02E 10/52* (2013.01); *H01L 31/0522* (2013.01); *G02B 19/00* (2013.01)
USPC ........................................................ 250/487.1

(58) Field of Classification Search
CPC ............................. H01L 31/022; H01L 31/055
USPC ......................... 359/589; 136/246; 250/487.1
See application file for complete search history.

(56) References Cited

U.S. PATENT DOCUMENTS

| 4,501,470 A | * | 2/1985 | Yeh ................ 359/887 |
| 2003/0218708 A1 | | 11/2003 | Ichihashi |

(Continued)

FOREIGN PATENT DOCUMENTS

| EP | 1854151 B1 | 7/2009 |
| WO | 2006088369 A2 | 8/2006 |

(Continued)

*Primary Examiner* — David Porta
*Assistant Examiner* — Edwin Gunberg
(74) *Attorney, Agent, or Firm* — Yuliya Mathis

(57) ABSTRACT

The present invention relates to a luminescent solar concentrator for a solar cell, comprising a collector with a luminescent substrate, and a wavelength selective filter, wherein the wavelength selective filter is arranged above the surface of the collector, wherein the luminescent substrate has an absorption edge which corresponds to a wavelength $\lambda_{ex}$ and emits radiation around a wavelength $\lambda_{em}$, wherein the selective filter has a refractive-index contrast $\Delta n$ with a negative or zero dispersion, and wherein the wavelength selective filter is designed to keep the emitted radiation inside the collector while shifting the reflection band of the incident radiation to angles $\geq 25°$ and/or to narrow the reflection band to a range of $\leq 10°$.

10 Claims, 2 Drawing Sheets

(56) References Cited

U.S. PATENT DOCUMENTS

2005/0224754 A1 10/2005 Hirai et al.
2008/0271784 A1 11/2008 Duston et al.
2009/0027872 A1* 1/2009 Debije et al. .................... 362/84
2010/0209593 A1* 8/2010 Banerjee et al. ................ 427/10

FOREIGN PATENT DOCUMENTS

| WO | 2007114871 | A1 | 10/2007 |
| WO | 2008119427 | A1 | 10/2008 |
| WO | 2008157621 | A2 | 12/2008 |
| WO | 2009039937 | A1 | 4/2009 |

* cited by examiner

LUMINESCENT SOLAR CONCENTRATOR

FIELD OF THE INVENTION

The invention relates to the field of solar concentrators. More particularly, the invention relates to solar concentrators comprising luminescent substrates.

BACKGROUND OF THE INVENTION

Solar concentrators are widely used to enhance the performance of solar cells.

The aim of solar concentrators is to collect incident radiation over a large surface and concentrate the energy to its edges where it is collected by solar cells or photovoltaic (PV) cells. Thus, the incident sunlight is focussed to the surface of the solar cell thereby increasing the power density of radiation which is subsequently converted into electric energy.

A well-known form of solar concentrators is a so called luminescent solar concentrator (LSC). A luminescent solar concentrator generally comprises a collector being designed as a flat and optically transparent or semi transparent sheet. This sheet often is formed of a material such as glass, polymer, or the like. The collector comprises or is coated with a luminescent substrate which absorbs the incident sunlight and emits light at longer wavelengths. Generally, the light of longer wavelengths is emitted in all directions. A substantial fraction of the emitted light however is captured in the sheet and is transported, via total internal reflection, to at least one edge of that flat sheet and thus to the surface of a solar cell, thereby concentrating the light from a large surface (the surface of the sheet) to a smaller surface (the surface of the edge). This effect is widely known as the "edge glow effect". The ratio of the light intensity at the surface area of the output (i.e. the edge) and to the light intensity at the surface area of the input (i.e. the collection area) is the so called concentration ratio.

In order to improve the concentration ratio, it is known to provide a filter or mirror on the surface of the solar concentrator. This filter has the objective to prevent the emitted radiation from leaving the luminescent solar energy concentrator and thus to prevent the emitted radiation from getting lost. However, this filter not only reflects the light being emitted from the inside of the collector but may also (at least partially) reflect incident sunlight. This leads to less sunlight entering the solar concentrator and thus decreasing the amount of light being guided to the solar cell.

The major drawback of these conventional luminescent solar concentrators is the insufficient concentration ratio leading to a great loss of radiation which is not used by the solar cell.

DEFINITIONS

The term "refractive index contrast", as used herein, shall refer to the difference in refractive indices between different materials in a multilayer ($\Delta n = n_h - n_l$, wherein $n_h$ is a high refraction index and $n_l$ is a low refraction index, or $\Delta n = n_e - n_o$, wherein ne is the extraordinary refraction index and no is the ordinary refraction index).

The term "absorption edge", as used herein, shall refer to a wavelength around which an abrupt rise in the absorption capability arises.

The term "reflection band", as used herein, shall refer to an angular range in which the radiation is reflected.

SUMMARY OF THE INVENTION

It is an object of the invention to provide a solar concentrator which overcomes the limitations as set forth above.

It is a further object of the invention to provide a luminescent solar concentrator which enhances the radiation being captured in the collector.

These objects are achieved by a luminescent solar concentrator according to claim 1. In particular, a luminescent solar concentrator is disclosed comprising a collector with a luminescent substrate, and a wavelength selective filter, wherein the wavelength selective filter is arranged above the surface of the collector, wherein the luminescent substrate has an absorption edge which corresponds to a wavelength $\lambda_{ex}$ and emits radiation around a wavelength $\lambda_{em}$, wherein the selective filter has a refractive-index contrast $\Delta n$ with a negative or zero dispersion, and wherein the wavelength selective filter is designed to keep the emitted radiation inside the collector while shifting the reflection band of the incident, i.e. exciting, radiation to angles $\geq 25°$ and/or to narrow the reflection band to a range of $\leq 10°$.

The present invention is based on the unexpected finding that by providing a wavelength selective filter with a refractive-index contrast $\Delta n$ with a negative or zero dispersion it is possible to shift the reflection band of the incident, radiation to angles $\geq 25°$ and/or to narrow the reflection band to a range of $\leq 10°$, the latter being particularly the case if the filter comprises a material with a positive dispersion of the average refractive index. It has been found that a positive dispersion affects the shift of the reflection band, whereas a negative dispersion of the refraction-index contrast affects the reflection bands becoming more narrow.

Advantageous angles, to which the reflection bands are shifted and which are part of the present invention, are angles, preferably ranging at values $\geq 35°$, in particular $\geq 50°$, and especially $\geq 90°$.

The width of the reflection band may preferably be narrowed to values $\leq 7°$, especially to values $\leq 5°$, and especially $\leq 2°$. In a special embodiment, the reflection band may be narrowed up to a width of 0°, which means, that the reflection band is not present at all.

This leads to the advantage that the wavelength selective filter reflects a great amount of radiation being emitted by the luminescent substrate, thus decreasing the loss of emitted radiation. In contrast thereto, the solar concentrator according to the invention decreases the amount of incident sunlight being reflected and thus being prevented from entering the collector.

The concentration ratio is thus enhanced and a luminescent solar concentrator according to the invention may in a surprising way decrease the loss of radiation and thus improve the performance of a solar cell or the power output of the latter, respectively.

Advantageously, the wavelength selective filter has a refractive-index contrast $\Delta n$ with a negative dispersion. This leads to the described effect of the reflection band being narrowed. This effect may also be achieved, if the selective filter has a refractive-index contrast $\Delta n$ with a zero dispersion.

In one embodiment, the selective filter is formed of a multilayer, the multilayer comprising a material with a high refractive index and a low dispersion and furthermore a material with a low refractive-index and a high dispersion. By using a multilayer, the optical properties of the single layers may very well be adjusted by choosing the single layers. By combining different layers, the optical properties of the selective filter as such may very well be adjusted.

In a further embodiment, the selective filter is based on cholesteric liquid-crystal polymers. These polymers are very well applicable for forming a selective filter as the optical properties may very well be defined during the polymerisation process and by the polymerisation conditions, or by choosing the respective monomers. The wavelength selective filter may thus very well be adjusted.

It is furthermore preferred, that the liquid-crystal polymer has a positive dispersion. This enables the reflection bands of the incident radiation being shifted to high angles thereby allowing a greater amount of radiation entering the collector.

In a further embodiment, the liquid-crystal polymer is formed of monomer molecules with three molecular entities, two of which are substantially parallel to each other and substantially perpendicular to the third one. These kinds of monomers will induce the desired properties in the respective polymer after the polymerisation process and are thus very well applicable.

It is furthermore preferred that the liquid-crystal polymer comprises at least one chiral unit. By introducing chiral units, the position of the reflection band may be exactly defined. Thereby, the resulting optical properties are very well adjustable, as they are highly dependant on the chiral unit as such as well as on the concentration of the chiral units.

BRIEF DESCRIPTION OF THE DRAWINGS

These and other aspects of the invention will be apparent from and elucidated with reference to the embodiments described hereinafter.

In the drawings.

DETAILED DESCRIPTION OF EMBODIMENTS

Figure 1:
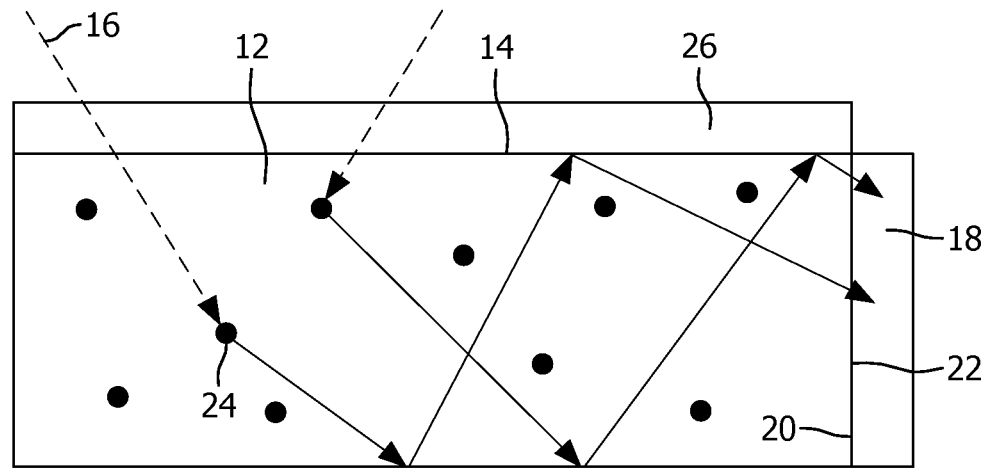
FIG. 1 shows a schematic view of a luminescent solar concentrator according to the invention.

In FIG. 1, a solar concentrator 10 according to the invention is schematically shown. The solar concentrator 10 comprises a collector 12 which advantageously is designed as a flat sheet. Preferably, the collector 12 is formed of a material which is optically transparent or at least semi transparent. Exemplary materials which are very well applicable are glass, polymers as polymethylmethacrylate, polycarbonate or the like. The collector 12 comprises a collection surface 14 which is preferably directed towards the incident sunlight. The incident sunlight is schematically illustrated by the dashed arrows 16.

A photovoltaic cell or solar cell 18 is mounted along an edge 20 of the collector 12. The solar cell 18 may be of any type. Suitable solar cells 18 include, but are not limited to bulk technology cells like amorphous silicon cells, multicrystalline silicon cells, polycrystalline silicon cells, monocrystalline silicon cells, or thin film cells like cadmium telluride cells, copper indium selenide cells, gallium arsenide cells, indium selenide cells, or copper indium gallium selenide cells. The solar cell 18 comprises a primary absorption surface 22 which faces the edge 20 of the collector 12.

It is possible to use one collector 12 with one solar cell 18. Furthermore, it is possible to design an array, thereby, by way of an example, positioning a bifacial solar cell 18 between two collectors 12. In this case, the solar cell 12 additionally comprises a second absorption surface.

Located in the collector 12 or coated thereon, a luminescent substrate or material, respectively, is provided. The luminescent substrate may consist of fluorophores or phosphors, for example in the form of a dye or as grains, i.e. luminophores 24. The luminophores 24 absorb sunlight that has a wavelength smaller or equal to the so-called absorption edge wavelength $\lambda_{ex}$. The incident radiation or sunlight, respectively, is absorbed by the luminophores 24, the latter thereby going in an excited state. Because of their luminescence behaviour, the luminophores 24, having absorbed the incident radiation, emit radiation in a longer wavelength $\lambda_{em}$ ($\lambda_{em} \geq \lambda_{ex}$). Generally, the emitted longer-wavelength light is emitted to all directions. However, a fraction of the longer-wavelength light is trapped in the collector 12 by total internal reflection (TIR) and is thereby guided through the collector 12 to its edge 20. This is illustrated by the arrows in FIG. 1. At the edge 22, the light is transferred to the absorption surface 20 of the solar cell 18.

The collector 12 thus concentrates the incident sunlight entering the collector 12 at its collection surface 14 and guides it to the solar cell 18. This enables more light to be used by the solar cell 18 and thus a higher energy output of the solar cell 18.

To increase the amount of emitted radiation being trapped in the collector 12, especially the radiation which is not trapped in the collector 12 by total internal reflection, a wavelength selective filter 26 is provided. The wavelength selective filter 26 may be arranged above the surface of the collector 12, i.e. it is arranged directly on the surface of the collector 12, or a gap between the surface of the collector 12 and the wavelength selective filter 26 may be provided. The wavelength selective filter 26 is also called photonic band-stop filter, interference filter or Bragg mirror. It is particularly advantageous, if the wavelength selective filter 26 is located on or just above the collection surface 14 of the collector 12 and thus above the surface of the luminescent substrate, even if this is provided in form of a coating. It is furthermore possible to provide a respective wavelength selective filter on each side of the collector 12.

The wavelength selective filter reflects the emitted radiation and thus prevents emitted radiation from being lost. Thus, the amount of radiation being trapped inside the collector 12 is increased leading to more radiation being guided to the solar cell 18 and thus to a higher energy output of the latter.

However, it is important to circumvent the effect of incident sunlight being reflected in a great amount. This reflection of incident light counteracts the desired effect because it decreases the amount of sunlight entering the solar cell 18.

This may be achieved by designing the filter 26 with a wavelength dependence. That means that the filter can reflect the emitted sunlight having a wavelength $\lambda_{em}$ but not reflecting the incident sunlight with a wavelength $\lambda_{ex}$ in a great amount.

Figure 2:
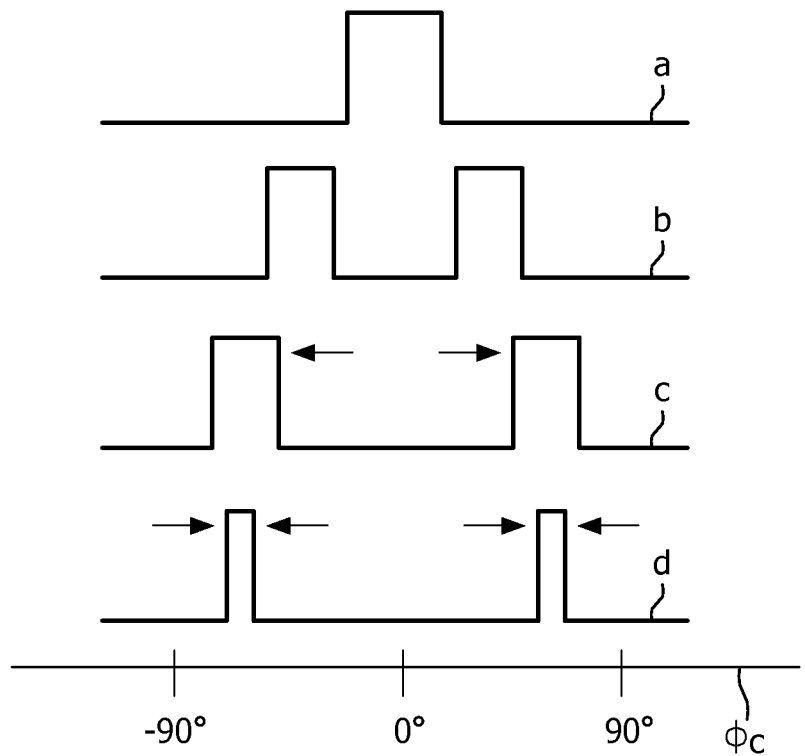
FIG. 2 shows the reflectivity of a luminescent solar concentrator according to the invention.

The reflectivity behaviour of a wavelength selective filter is shown in FIG. 2.

In FIG. 2, the reflectivity of the wavelength selective filter 26 is plotted against the angle of incidence of the radiation. Curve a shows the desired reflection band in the collector 12 for radiation at emission wavelength $\lambda_{em}$. Curve a comprises a broad peak around an angle $\Phi=0°$. This broad peak illustrates the reflection band of the wavelength selective filter, the reflection band being an angular range in which the respective radiation is reflected. It is thus most desired, that this reflection band extends from an angle $-\Phi$ to an angle $\Phi$, when $\Phi=\Phi_c=\mathrm{asin}\,(1/n(\lambda_{em}))$ is the critical angle of total reflection and $n(\lambda_{em})$ is the refractive index at the indicated wavelength. This means, that the wavelength selective filter reflects all radiation, which was emitted by the luminophores 24 in the range from $-\Phi_c$ to $\Phi_c$. All radiation hitting the wavelength selective filter 26 at angles lying outside this region, are in the range of total internal reflection. Therefore, no emitted radiation is lost but all is guided to the edge 20 and thus to the solar cell 18.

Curve b shows the reflectivity for radiation at exciting wavelength $\lambda_{ex}$, thus, the reflection of the incident sunlight. This curve may be obtained, if the wavelength selective filter is formed of a material which has no dispersion with respect to the refractive index, which means that the refractive index is independent of the wavelength of the radiated light ($n(\lambda_{ex})= n(\lambda_{em})$). Another characteristic of such a material is the property of the refractive index contrast which is obtained as $\Delta n(\lambda_{ex})=\Delta n(\lambda_{em})$. It can be seen that two reflection bands are present, in which the incident sunlight is reflected and thus prevented to enter into the collector 12.

To increase the amount of incident sunlight entering the collector 12, one possibility is to shift the reflection bands to high angles. This means that only sunlight which hits the wavelength selective filter at high angles will be reflected. Generally, the collection surface 14 of the solar cell 18 is directed towards the incident sunlight thereby enabling a small angle of incidence. Thus, reflection bands at high angles will cause only a small amount of incident radiation being reflected and thus lost.

The shift of the reflection bands is shown schematically in FIG. 2 and illustrated by curve c. The shift is illustrated by the arrows. It may be seen that the reflection bands are shifted to higher angles. It is preferable, if the reflection bands of the exciting radiation are shifted to angles $\geq 25°$, whereby it is especially preferable if the reflection bands of the exciting radiation are shifted to angles $\geq 35°$, especially $\geq 50°$ and most desirably $\geq 90°$. This kind of shift may be achieved by providing a material with a positive dispersion of the (average) refractive index $n(\lambda_{ex})>n(\lambda_{em})$ in the wavelength selective filter, like described below. Accordingly, the refractive index is greater at shorter wavelengths compared to longer wavelengths.

Another way of decreasing the amount of incident, i.e. exciting, radiation with a wavelength $\lambda_{ex}$ being reflected and thus prevented from entering the collector 12 is to narrow the reflection bands of the incident radiation. This is schematically demonstrated by curve d and illustrated by the arrows. A narrowing of the reflection bands means, that the width of the reflection band, in which incident radiation is reflected is smaller. The widths of the reflection bands are determined by the refractive index contrast in the filter 26. A narrowing of the reflection bands may be achieved by providing a wavelength selective filter which comprises a material with a negative dispersion of the refractive-index contrast ($\Delta n(\lambda_{ex})<\Delta n(\lambda_{em})$). It is preferable, that the reflection bands are narrowed to a range of $\leq 10°$, whereby it is especially preferable if the reflection bands of the exciting radiation is narrowed to a range of $\leq 7°$, especially $\leq 4°$ and most desirably $\leq 1°$. Of course, it is especially preferable, if the reflection band is narrowed to a range of $0°$ and the reflection bands are not present at all.

This effect may very well be combined with a shift of the reflection bands to higher angles. This is especially the case, if the materials in the wavelength selective filter not only have negative dispersion of the refractive-index contrast, but also have a positive dispersion ($n(\lambda_{ex})>n(\lambda_{em})$).

It is thus desirable to provide a wavelength selective having reflection bands of the emitted radiation being narrow and/or being shifted to high angles.

This may be achieved by using a wavelength selective filter being formed of a multilayer of dielectric layers. In this case, it is possible to use materials having a positive dispersion leading to the reflection bands of the emitted radiation being shifted to higher angles. Instead of using materials with a positive dispersion or additionally thereto, the used materials may have differences in their refractive indices being designed such, that the refractive-index contrast $\Delta n$ will have a negative dispersion, thereby narrowing the respective reflection bands. This will lead to a wavelength selective filter which increases the amount of radiation trapped in the collector 12 by a large amount.

Preferably, the multilayer comprises a material with a high refractive index and a low dispersion and furthermore a material with a low refractive index and a high dispersion. Furthermore, it is possible to use a multilayer comprising many layers with a small refractive-index contrast. Here, it is especially preferable, if the constituting layers comprise birefringent polymers.

Another possibility to achieve a wavelength selective filter according to the invention is to form the latter by using liquid-crystals, especially cholesteric liquid-crystals. It is important that the liquid-crystals are chosen to have a positive dispersion ($n(\lambda_{ex})>n(\lambda_{em})$). This effects the reflection bands of the emitted radiation being shifted to high angles. Additionally, or instead of having a positive dispersion, it is desired, that the used liquid-crystals have a birefringence with a negative dispersion effecting a refractive-index contrast with a negative dispersion ($\Delta n(\lambda_{ex})<\Delta n(\lambda_{em})$). In this case, the reflection bands of the emitted radiation are narrowed like stated above. A further advantage of a wavelength selective filter comprising a material with a refractive-index contrast having a negative dispersion is their property of having a reflection band with a substantially rectangular shape. A rectangular shape is desirable as there are sharp borders between the reflection region and the non-reflection region.

As far as filters 26 comprising cholesteric liquid-crystals are concerned, it is preferable to use cholesteric polymers made by polymerisation of liquid-crystal monomers.

Figure 3:
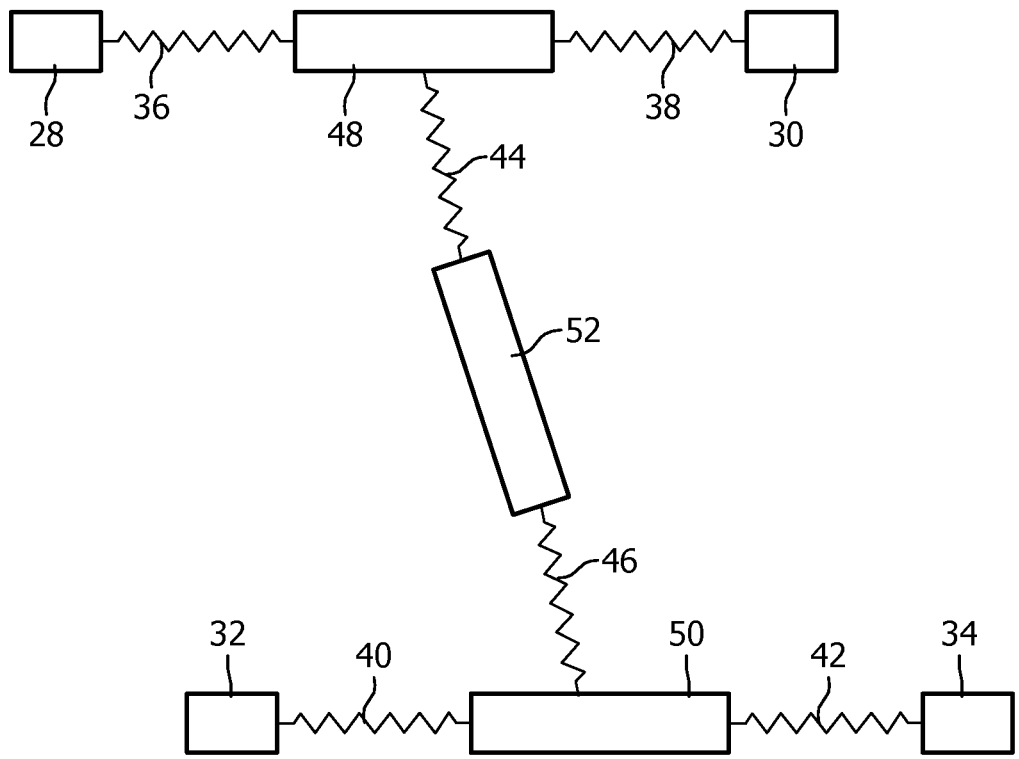
FIG. 3 shows a schematic view of a preferable monomer for forming a luminescent solar concentrator according to the present invention.

A preferable general structure of molecules which may be used according to the present invention is shown in FIG. 3. According to FIG. 3, the molecules are designed such that they consist of three rod-like mesogenic molecule entities, two of which, in the ordered state, are oriented substantially parallel to each other, and furthermore substantially perpendicular to the third one. Generally, the two parallel entities have a rather low contribution to the refractive index and the birefringence dispersion, whereas the third entity has a relatively high contribution to the refractive index and the birefringence dispersion. Such a molecule design of a liquid-crystal monomer leads to a birefringence with a negative dispersion of the refractive index and to a positive dispersion. It is, however, to be noted that the dispersion is dependent on the molecule axis.

The moieties 28, 30, 32, 34 may be either functional end groups which can be polymerized to form a polymer network or the moieties are just end groups not participating in the polymerization process. However, it is preferable that one of the moieties 28, 30, 32, 34 is a functional group. The moieties may 28, 30, 32, 34 may, by way of example, be selected out of the group comprising:

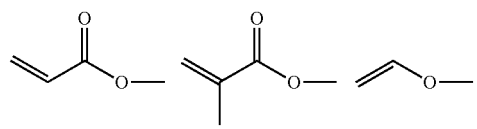

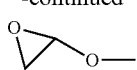

The moieties 36, 38, 40, 42, 44, 46 may be spacer groups which connect the various functional moieties. The spacer group can for instance be an alkylene group, but it may also be a group which provides a certain functionality, such as chirality. It is furthermore possible to provide direct bonds between the functional moieties, especially for connecting the moieties 52 to 48 and 50. The moieties 36, 38, 40, 42, 44, 46 may, by way of example, be selected out of the group comprising:

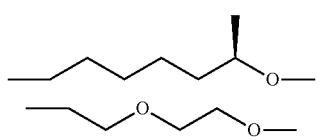

The moieties 48 and 50 may be rod-like mesogenic units. They have a rather small contribution to the refractive index and birefringence dispersion. These moieties may contain saturated rings to keep the polarizability low. The moieties 48 and 50 may, by way of example, be selected out of the group comprising:

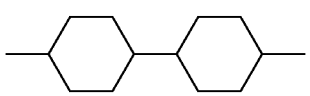

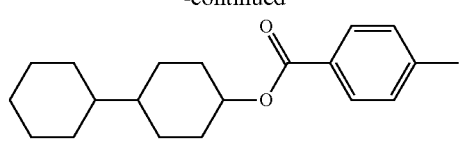

The moiety 52 may be a rod-like mesogenic unit with a relatively low contribution to the refractive index and the birefringence dispersion. In the oriented state of the monomer, moiety 52 is orienting itself, in an orientation being on average perpendicular or close to perpendicular to the orientation of moieties 48 and 50. These moieties may comprise conjugated unsaturated groups to make the polarizability high. The moiety 52 may, by way of example, be selected out of the group comprising:

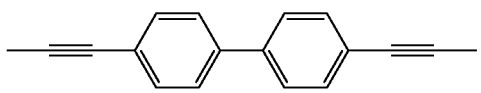

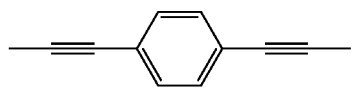

According to the above, some advantageous examples of monomers for forming a wavelength selective filter may, by way of example, be selected out of the group comprising:

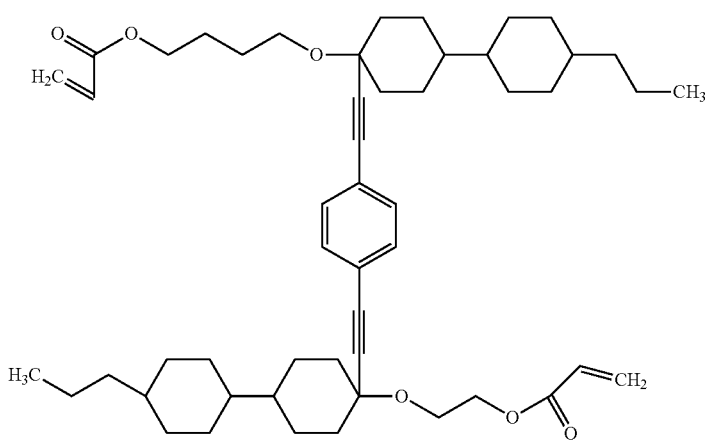

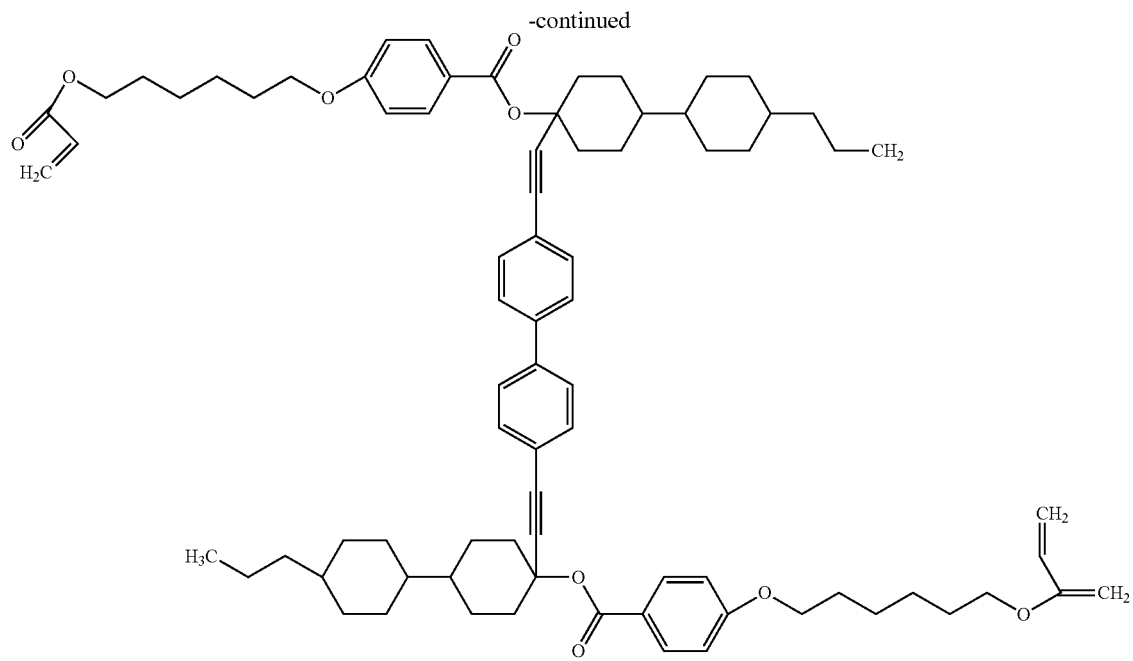

In order to make processing more easy, to stabilize the liquid crystal nematic phase and to tailor the optical properties, the above defined examples or other corresponding monomers may be mixed with more conventional liquid-crystal monomers. These conventional liquid-crystal monomers may have a structure like shown in FIG. 4. The monomer shown in FIG. 4 comprises moieties 28, 30, 36, and 38 which may be similar to those described in FIG. 3. Furthermore, the conventional liquid-crystal monomer comprises a central moiety 56, which may be similar to moiety 48 of FIG. 3. Apart from that, it may as well be possible to design moiety 56 with more aromatic groups. This leads to the moiety 56 stabilizing the liquid-crystal properties. The moiety 56 may, by way of example, be selected out of the group comprising:

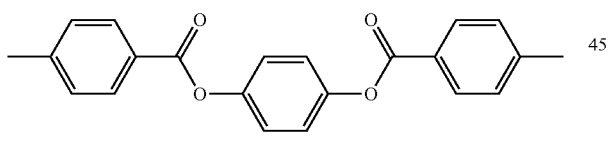

-continued

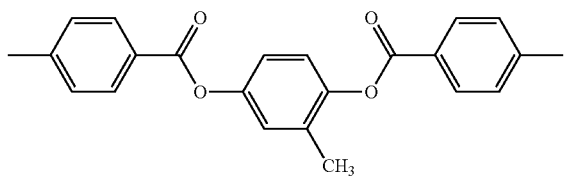

Correspondingly, applicable liquid-crystal monomers for stabilizing the liquid-crystal properties according to figure may, by way of example, be selected out of the group comprising:

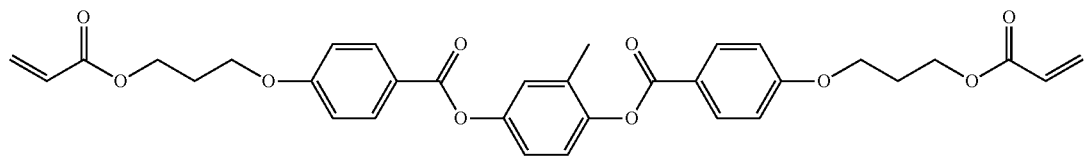

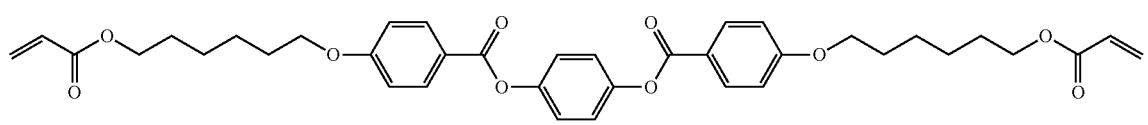

Figure 4:
FIG. 4 shows a schematic view of a monomer which can be used together with the monomer of FIG. 3.

Rather than using two-component mixtures comprising monomers according to FIGS. 3 and 4, the reactive monomer blends may comprise many components with different monomers. By way of example, it is possible to incorporate photoinitiators, stabilizers etc. to improve processing properties of the monomers and the mechanical and optical properties of the polymers or polymer networks, respectively, formed from the monomers.

In order to induce the cholesteric phase that leads to wavelength-dependant reflection, at least one of the monomers should be chiral or contain a chiral group, respectively. The group can for instance be incorporated in the spacer units 36, 38, 40, 42 or as well in a central moiety 56. One exemplary chiral unit may be

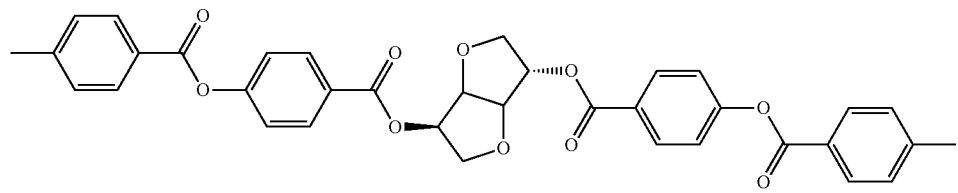

Exemplary chiral monomers which are well applicable for the present invention are selected, by way of example, out of the group comprising:

It has to be noted that the concentration of monomers with chiral units determine the position of the reflection band. In general, the concentration of chiral units or dopant, respectively, may vary between 0.1 and 100%, preferred values may range between 20 and 40 wt %. However, the concentration of the chiral unit is dependent on the helical twisting power (HTP=1/pc, wherein p is the pitch of the helix and c is the concentration of the dopant in wt %/100).

A general way of forming an optical film is by coating a substrate, for instance the collector 12, with the monomer mixture from solution for instance by slot die coating or offset printing. The procedure is then as follows: The monomers are dissolved in a solvent like xylene and the solvent is evaporated after application by moderately heating and the monomer mixture is kept in its liquid-crystalline phase by adjusting the temperature. Next, the monomers are polymerized to a polymer network by a short UV exposure. Defect-free mono-

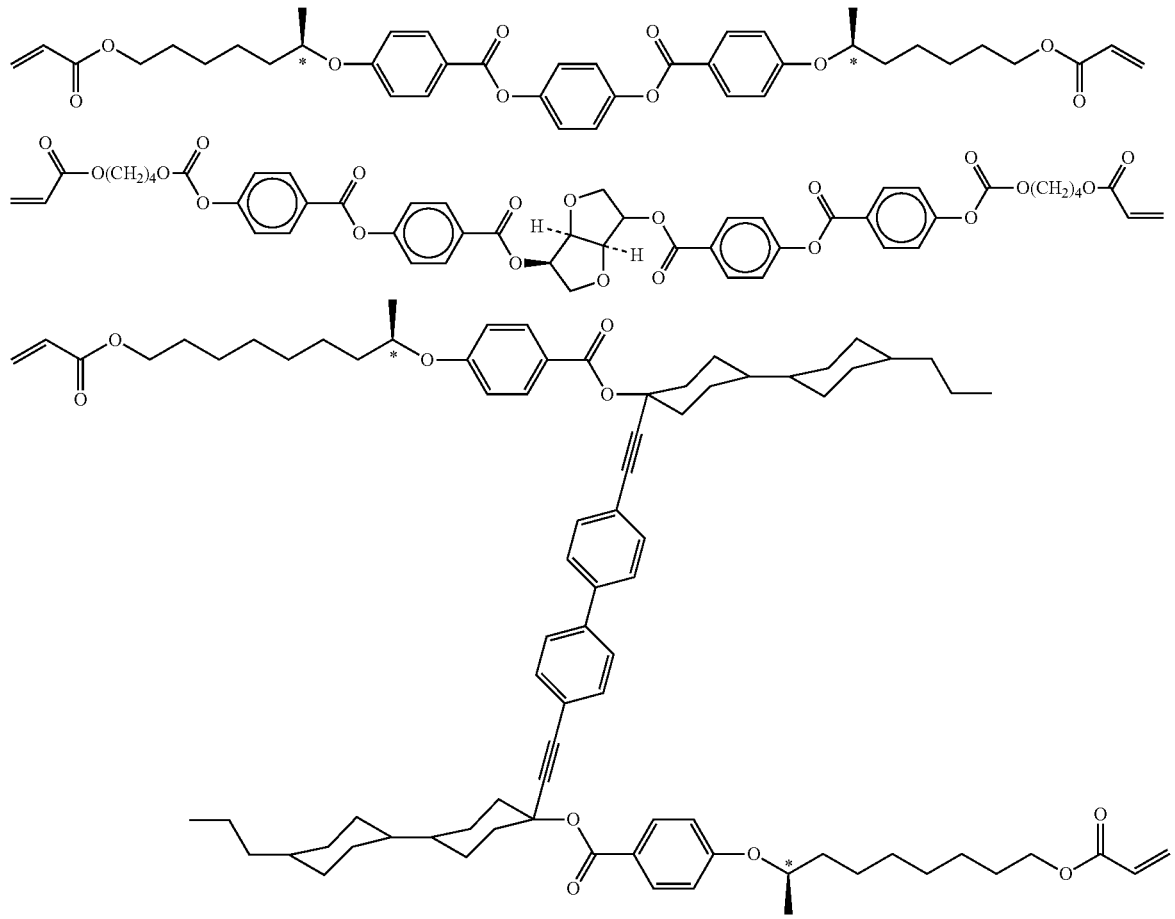

lithic alignment of the molecules is promoted by an aligning medium on which the monomer blend is applied prior to polymerization. This can be a thin polyimide coating that is rubbed by a polyester tissue as is known from LCD manufacturing, or it can be the substrate itself that is rubbed.

In general, the moieties 48 and 50 and 56 are aligned planar and moiety 52 aligns itself on average perpendicular to this. The alignment of the groups 52 compensates for the alignment of the groups 48, 50 and 56. But the wavelength dependence of the group 52 birefringence is much steeper than those of 48, 50 and 60. As a result, the birefringence at large wavelengths is higher than at shorter wavelengths.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. Luminescent solar concentrator for a solar cell, comprising
   a collector with a luminescent substrate, and
   a wavelength selective filter,
   wherein the wavelength selective fitter is arranged above a surface of the collector,
   wherein the luminescent substrate has an absorption edge which corresponds to a wavelength $\lambda_{ex}$ and emits radiation around a wavelength $\mu_{em}$,
   wherein the wavelength selective filter has a refractive-index contrast $\Delta n$ with a negative or zero dispersion for the wavelengths $\lambda_{ex}$ and $\lambda_{em}$, and
   wherein the wavelength selective filter is configured to keep the emitted radiation inside the collector while shifting a reflection band of incident radiation to angles $\geq 25°$ and/or narrowing the reflection band to a range of $\leq 10°$.

2. Luminescent solar concentrator according to claim 1, wherein the wavelength selective filter is configured to shift the reflection band of the incident radiation to angles $\geq 35°$.

3. Luminescent solar concentrator according to claim 1, wherein the wavelength selective filter is configured to narrow the reflection band to a range of $\leq 7°$.

4. Luminescent solar concentrator according to claim 1, wherein the selective filter has a refractive-index contrast $\Delta n$ with a negative dispersion.

5. Luminescent solar concentrator according to claim 1, wherein the selective filter has a refractive-index contrast $\Delta n$ with a zero dispersion.

6. Luminescent solar concentrator according to claim 1, wherein the selective filter is formed of a multilayer, the multilayer comprising a material with a high refractive index and a low dispersion and furthermore a material with a low refractive index and a high dispersion.

7. Luminescent solar concentrator according to claim 1, wherein the selective filter is based on cholesteric liquid-crystal polymers.

8. Luminescent solar concentrator according to claim 7, wherein the liquid-crystal polymer has a positive dispersion.

9. Luminescent solar concentrator according to claim 7, wherein the liquid-crystal polymer is formed of monomer molecules with three molecular entities, two of which are substantially parallel to each other and substantially perpendicular to the third one.

10. Luminescent solar concentrator according to claim 7, wherein the liquid-crystal polymer comprises at least one chiral unit.

* * * * *